(12) United States Patent
Uhlig et al.

(10) Patent No.: US 6,583,020 B2
(45) Date of Patent: Jun. 24, 2003

(54) METHOD FOR FABRICATING A TRENCH ISOLATION FOR ELECTRICALLY ACTIVE COMPONENTS

(75) Inventors: Ines Uhlig, Dresden (DE); Jens Zimmermann, Langebruck (DE); Stephan Wege, Weissig (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/953,614

(22) Filed: Sep. 11, 2001

(65) Prior Publication Data

US 2002/0086478 A1 Jul. 4, 2002

Related U.S. Application Data

(63) Continuation of application No. PCT/DE00/00805, filed on Mar. 13, 2000.

(30) Foreign Application Priority Data

Mar. 11, 1999 (DE) ............................. 199 10 886

(51) Int. Cl.[7] .................... H01L 21/20; H01L 21/461
(52) U.S. Cl. ..................... 438/387; 438/706; 438/713
(58) Field of Search ........................... 438/424, 706, 438/712, 713, 714, 719, 386, 387

(56) References Cited

U.S. PATENT DOCUMENTS

| | | | | |
|---|---|---|---|---|
| 4,352,724 A | * | 10/1982 | Sugishima et al. | 204/192 E |
| 4,386,887 A | * | 6/1983 | Daubenspeck et al. | 156/643 |
| 4,729,815 A | | 3/1988 | Leung | |
| 4,855,017 A | | 8/1989 | Douglas | |
| 5,286,344 A | * | 2/1994 | Blalock et al. | 156/657 |
| 5,814,563 A | * | 9/1998 | Ding et al. | 438/714 |
| 6,110,792 A | * | 8/2000 | Bronner et al. | 438/386 |
| 6,140,168 A | * | 10/2000 | Tan et al. | 438/197 |
| 6,183,878 B1 | | 2/2001 | Berneth et al. | 428/583 |
| 6,376,383 B2 | * | 4/2002 | Mitsuiki | 438/706 |

FOREIGN PATENT DOCUMENTS

| | | |
|---|---|---|
| EP | 0 200 951 A2 | 12/1986 |
| JP | 61247032 | 11/1986 |
| JP | 05259269 | 10/1993 |

OTHER PUBLICATIONS

Stanley Wolf Silicon Processing for the VSLI Era vol. 2 Lattice Press 1990 p. 56.*

* cited by examiner

*Primary Examiner*—Carl Whitehead, Jr
*Assistant Examiner*—David S Blum
(74) *Attorney, Agent, or Firm*—Laurence A. Greenberg; Werner H. Stemer; Ralph E. Locher

(57) ABSTRACT

A method for fabricating a trench isolation for electrically active components in a semiconductor component. A mask is applied to a semiconductor substrate. Subsequently, a trench having side walls is formed in the semiconductor substrate by performing a dry etching process using at least one etching gas such that during the dry etching process, polymers are produced that at least partly cover the side walls of the trench and thereby at least partially protect the side walls against an etching attack from the etching gas. The etching gas is provided with a compound that is selected from the group consisting of at least one hydrocarbon compound and a fluorinated hydrocarbon compound. The trench is filled with an insulating oxide.

9 Claims, 2 Drawing Sheets

METHOD FOR FABRICATING A TRENCH ISOLATION FOR ELECTRICALLY ACTIVE COMPONENTS

CROSS-REFERENCE TO RELATED APPLICATION

This application is a continuation of copending International Application No. PCT/DE00/00805, filed Mar. 13, 2000, which designated the United States.

BACKGROUND OF THE INVENTION

Field of the Invention

The invention lies in the field of semiconductor technology and relates to a method for fabricating a trench isolation for electrically active components in a semiconductor component in which the trench isolation has at least one trench built with an oxide as an insulator. Such a method includes the following steps: a mask is applied to the semiconductor substrate; and a trench is subsequently formed in the semiconductor substrate by means of a dry etching step using at least one etching gas. During the dry etching process, polymers are produced which at least partly cover the side walls of the trench and thus, at least partially, protect the side walls against an etching attack from the etching gas.

A trench isolation for electrically active components, in particular, a shallow trench isolation produced in crystalline silicon, for example, has a trench filled with an oxide, for example. In the case of a dynamic semiconductor memory (DRAM), a capacitor element is arranged below the trench isolation. This capacitor element is delimited from the surrounding silicon by a collar that includes an oxide layer. A trench isolation of this type is disclosed for example in U.S. Pat. No. 5,389,559.

During the fabrication of this trench isolation, individual process steps are carried out at very high process temperatures at which the semiconductor substrate is exposed to a considerable thermal stress, in particular, during the heating and cooling phases. In this case, mechanical stresses arise in the semiconductor substrate, and can result in defects in the crystal lattice structure. At such sites, stress concentration sites arise which can trigger the formation of dislocations. Such dislocations can then lead to electrical defects, for example, leakage currents. These leakage currents cause a reduced retention time, with the result that the function of the active components (transistor, capacitor element, etc.) is restricted.

U.S. Pat. No. 5,807,789 discloses a method of the type mentioned in the introduction which can be used to create a trench isolation. The trench of the trench isolation has inclined side walls and round corners. In this method, the formation of polymers and their deposition on the side walls of the developing trench is utilized for protecting the side walls at least partly against an attack by the etching gases and thereby for achieving an etching profile with inclined side walls, and if appropriate, rounded corners. It is thus attempted to avoid sharp edges at the transition region between the bottom and the side walls of the trench since it has been found that such sharp edges can be the starting point for the above-described defects in the crystal lattice structure.

It is unfavorable that a mixture of chlorine-, bromine- and fluorine-containing gases is used in the method taught in U.S. Pat. No. 5,807,789. This mixture is very aggressive and is difficult to control. This means that the polymer formation cannot be influenced in the desired manner.

SUMMARY OF THE INVENTION

It is accordingly an object of the invention to provide a simple method for fabricating a trench isolation which overcomes the above-mentioned disadvantageous of the prior art methods of this general type.

With the foregoing and other objects in view there is provided, in accordance with the invention, a method for fabricating a trench isolation for electrically active components in a semiconductor component. A mask is applied to a semiconductor substrate. Subsequently, a trench having side walls is formed in the semiconductor substrate by performing a dry etching process using at least one etching gas such that during the dry etching process, polymers are produced that at least partly cover the side walls of the trench and thereby at least partially protect the side walls against an etching attack from the etching gas. The etching gas is provided with a compound that is selected from the group consisting of at least one hydrocarbon compound and a fluorinated hydrocarbon compound. The trench is filled with an insulating oxide.

The formulated object on which the invention is based is achieved by virtue of the fact that the etching gas contains at least one hydrocarbon compound and/or a fluorinated hydrocarbon compound.

These etching gases are easier to control, and in particular, can also be combined more easily with other etching steps which use related etching gases. Suitable etching gases are $CH_4$, $CHF_3$, $CH_2CF_2$ or $CH_3F$, which may additionally contain $NF_3$, $SF_6$, $N_2$, $O_2$ and/or Ar.

Using the method to form a trench isolation enables reliable prevention of the formation of defects in the crystal lattice structure. Furthermore, the inclined (tapered) side walls have the particular advantage that the process of filling the STI with an oxide, which process is necessary after the dry etching process, is significantly improved.

In accordance with an added feature of the invention, the etching gas has $NF_3$, $CHF_3$ and $N_2$ with a predominant proportion of $CHF_3$ and little NF3.

In accordance with an additional feature of the invention, after the formation of the trench, a further dry etching step using a further etching gas is carried out, by means of which the corners of the transition between the bottom of the trench and the side walls thereof are rounded. The further dry etching step has an isotropic etching component. This produces inclined side walls with rounded corners. Preferably, during this dry etching step, the further etching gas contains $NF_3$, $CHF_3$, and $N_2$ with a predominant proportion of $NF_3$.

In accordance with another feature of the invention, the dry etching steps are assisted by magnetic-field-enhanced reactive ion etching with ICP (Inductive Coupled Plasma Source) or with ECR (Electrical Cyclotron Resonance).

In accordance with a further feature of the invention, a tapered mask is used for dry etching.

If the trench is formed only in one dry etching step, care should be taken to ensure that an oxide collar of a capacitor element is etched at the same rate as the remaining oxide or the surrounding semiconductor substrate. The oxide collar could possibly be situated at the bottom of the trench.

In accordance with a concomitant feature of the invention, instead of the hydrocarbon compounds and/or the fluorinated hydrocarbon compounds, it is also possible to use a gas mixture including HBr, $Cl_2$, HCl and $O_2$, $N_2$ as additives.

Other features which are considered as characteristic for the invention are set forth in the appended claims.

Although the invention is illustrated and described herein as embodied in Method for fabricating a trench isolation for electrically active components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
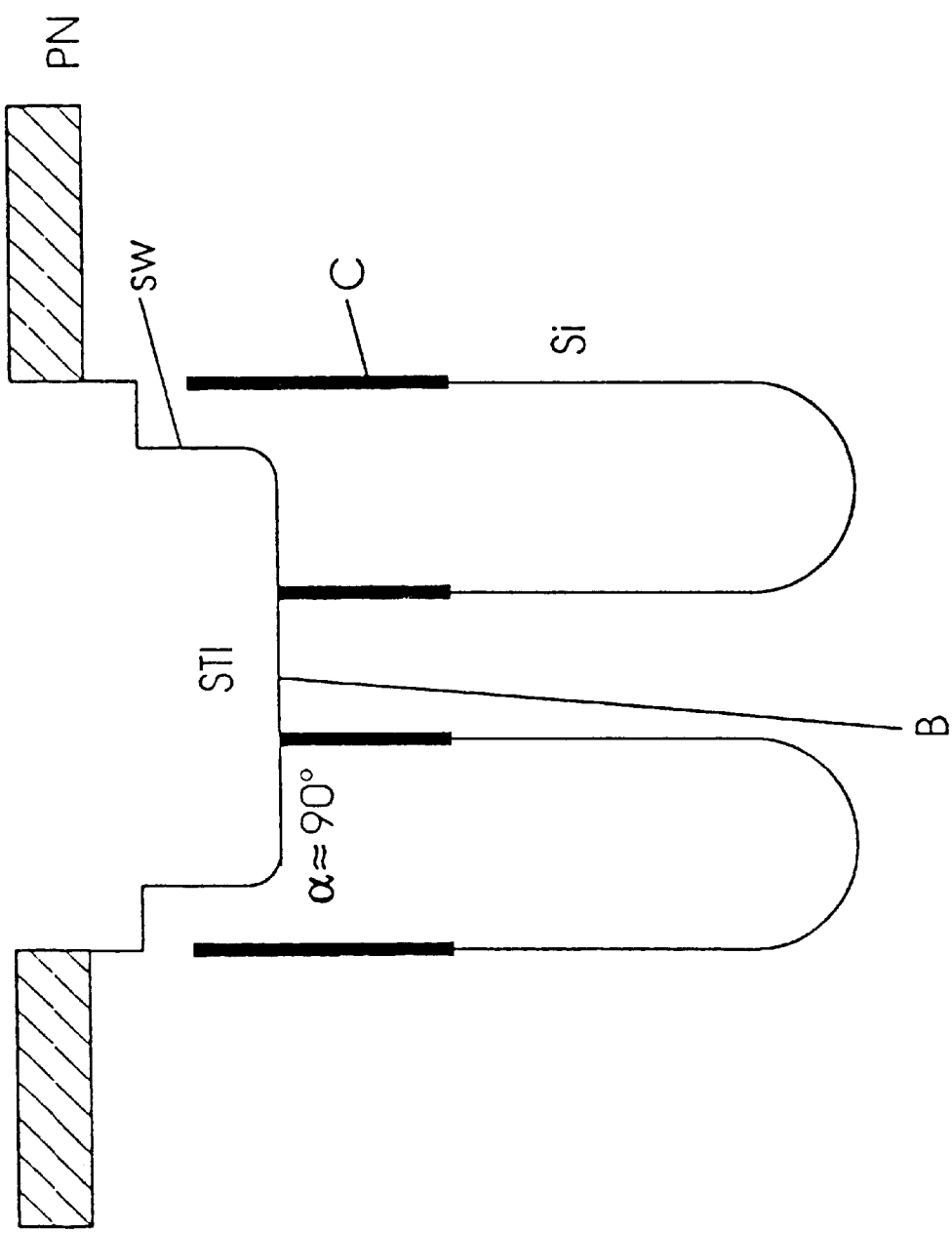
FIG. 1 shows a trench isolation (shallow trench isolation) with rounded edges at the bottom.
Figure 2:
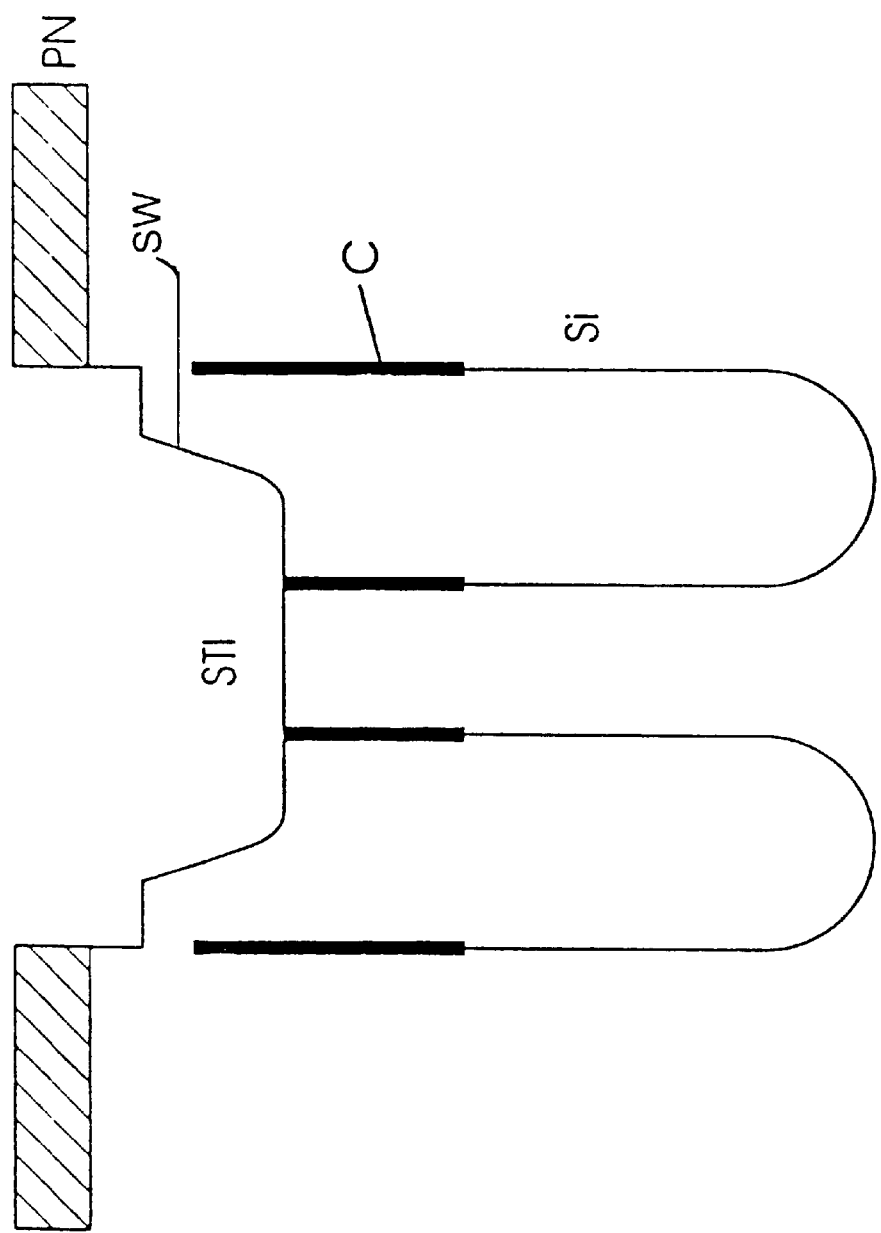
FIG. 2 shows a trench isolation with rounded edges at the bottom and with beveled side walls.

Referring now to the figures of the drawing in detail and first, particularly, to FIG. 1 thereof, there is shown a trench isolation STI having a trench with a bottom B. The bottom B is configured in such a way that it merges continuously with the side walls SW. The transition between the bottom B and the side walls SW is preferably rounded as shown in FIG. 1. Although this already enables an extensive reduction in thermally induced stresses in the crystal lattice structure of the polycrystalline silicon and of the crystalline silicon, the trench or the trench isolation can also be provided with tapered, i.e. beveled, side walls as shown in FIG. 2. The angle a between the bottom and the side walls SW should be between 75°<a<90°. A particular advantage of tapered side walls SW can also be seen in the improved geometry for filling the trench with an oxide.

Both measures can be employed either separately or in combination with one another.

The fabrication of the trench isolation STI will be explained in more detail below using an example. In this example, the trench isolation STI serves for insulating two adjacent trench capacitors which were etched into the SI substrate, which forms the semiconductor substrate in this case, and are filled with polysilicon after the formation of a capacitor dielectric and of a collar on the lower and upper trench walls. The trench isolation partly overlaps the trench capacitors, as can be seen in the figures.

For this purpose, in this case, first the pad nitride PN ($Si_3N_4$) is etched, and if appropriate, other residues of a trench etching mask are also etched. Then the polysilicon and crystalline silicon are etched with a high selectivity with respect to the resist mask. The collar C must also be etched at the same etching rate. The STI can be fabricated in a multistage or a single-stage method. For this purpose, $CHF_3$, $CH_4$, $CH_3F$ are used as process gases for the dry etching of the tapered side walls of the STI. It is additionally possible to provide a process of dry etching by magnetic-field-enhanced reactive ion etching. In addition, a tapered mask can be used for the dry etching process.

Etching gases with $CHF_3$ and $NF_3$ in the ratio 1.8:1 to 3:1 have proved to be particularly suitable for etching the silicon in order to form the trench. Etching gases having $N_2$, $NF_3$ and $CHF_3$ are likewise particularly suitable. The individual components are present in the ratio $N_2/(NF_3+CHF_3)$ of 4:1 to 5:1. In this case, the ratio of $NF_3$ to $CHF_3$ may be as described above. Furthermore, it is favorable to work at an average pressure of about 55 mTorr and an average plasma excitation power. The plasma excitation power should not exceed 1000 W.

During this etching process, polymers form which are deposited on the etched silicon substrate. As a result, a chemical attack by the etching gases is first of all prevented, since the bare silicon surface is protected by the polymers. However, since the dry etching method also has a physical etching component by virtue of the directed and accelerated ions of the etching gases or of further gases, the polymers are decomposed again. The decomposition process is greater on horizontal areas, lying essentially perpendicular to the incoming ions, than on vertical areas. By contrast, the buildup process, i.e. the rate of polymer deposition, is approximately the same on all areas. Consequently, the polymers are repeatedly removed from horizontal areas, thereby enabling an attack by the etching gases. By contrast, a polymer layer of increasing thickness is formed on vertical areas, and thus also on the developing side walls of the trench. The polymer layer has the effect that an ever smaller area at the bottom of the trench remains uncovered and can be removed by the etching gases. The trench therefore tapers to an increasing extent and inclined side walls develop. The steepness of the side walls can therefore be set by way of the ratio between physical and chemical components of the etching method. The physical component can be increased, for example, by adding Ar.

The process conditions should preferably be chosen so as to result in enhanced polymer formation.

This dry etching step may be followed by a further dry etching step, by means of which, the corners at the transition between the bottom of the trench and the side walls thereof are intended to be rounded. The dry etching provided for this purpose is in this case preferably performed using a gas mixture including $NF_3$, $CHF_3$, $N_2$ with a predominant portion of $NF_3$, with the result that an isotropic process control is achieved.

In the further dry etching step, an etching gas without $CHF_3$ has proved to be particularly suitable. The gas contains $N_2$ and $NF_3$ in the ratio 4:1 to 8:1. However, it is also possible to use further etching gases containing $CHF_3$. The gases then contain $N_2$, $NF_3$ and $CHF_3$ in the ratio $N_2/(NF_3+CHF_3)$ of 4:1 to 5:1. In this case, too, it is possible, as above, to work at a pressure of 55 mTorr and with a maximum excitation power of 1000 W.

It is also possible to use other etching gases. $SF_6$, HBr, $Cl_2$, and HCl have likewise proved to be suitable, and $N_2$, $O_2$ or Ar may be admixed with them as an additive.

The etched trench is subsequently filled with silicon oxide, for example using TEOS (Tetra Ethyl Ortho Silicate). In many cases, planarization by means of CMP (Chemical Mechanical Polishing) is carried out before the further structural construction. During this planarization, the layers (in this case the TEOS that is applied over the whole area and preferably also the pad nitride layer) that are still situated on the surface of the (mono-) crystalline Si substrate are preferably completely removed.

We claim:

1. A method for fabricating a trench isolation for electrically active components in a semiconductor component, which comprises:

providing a silicon substrate with at least one trench capacitor formed therein, the capacitor having a collar;

applying a mask to the silicon substrate;

providing an etching gas including $CHF_3$, $NF_3$, and $N_2$, with a predominant portion of $CHF_3$, and with less $NF_3$ than $N_2$ and $CHF_3$;

subsequently forming a trench having side walls, the trench being formed in the silicon substrate and partially in the trench capacitor by performing a dry etching process using at least one etching gas such that during the dry etching process, polymers are produced that at least partly cover the side walls of the trench and thereby at least partially protect the side walls against an etching attack from the etching gas, whereby the silicon substrate and the collar being etched at the same etching rate; and filling the trench with an insulating oxide.

2. The method according to claim 1, which comprises providing the etching gas with a component selected from the group consisting of $CH_4$, $CH_2CF_2$ and $CH_3F$.

3. The method according to claim 2, which comprises providing the etching gas with a component selected from the group consisting of $SF_6$, $O_2$ and Ar.

4. The method according to claim 1, which comprises providing the etching gas with a component selected from the group consisting of $SF_6$, $O_2$ and Ar.

5. The method according to claim 1, which comprises performing the dry etching process using magnetic-field-enhanced reactive ion etching with ICP.

6. The method according to claim 1, which comprises performing the dry etching process using magnetic-field-enhanced reactive ion etching with ECR.

7. The method according to claim 1, which comprises providing the mask with inclined side walls.

8. The method according to claim 1, which comprises, after forming the trench, rounding corners of transition regions between the side walls of the trench and a bottom of the trench by performing an isotropic dry etching step with a further etching gas.

9. The method according to claim 8, which comprises providing the further etching gas with $NF_3$, $CHF_3$, and $N_2$ such that the $NF_3$ is a predominant proportion of the further etching gas.

* * * * *